United States Patent
Kasama

(10) Patent No.: US 8,079,477 B2
(45) Date of Patent: *Dec. 20, 2011

(54) WAFER CONTAINER WITH CUSHION SHEETS

(75) Inventor: Nobuyuki Kasama, Tokyo (JP)

(73) Assignee: Miraial Co., Ltd., Tokyo (JP)

( * ) Notice: Subject to any disclaimer, the term of this patent is extended or adjusted under 35 U.S.C. 154(b) by 376 days.

This patent is subject to a terminal disclaimer.

(21) Appl. No.: 12/293,329

(22) PCT Filed: Jul. 3, 2007

(86) PCT No.: PCT/JP2007/063274
§ 371 (c)(1),
(2), (4) Date: Sep. 17, 2008

(87) PCT Pub. No.: WO2008/010411
PCT Pub. Date: Jan. 24, 2008

(65) Prior Publication Data
US 2011/0042266 A1 Feb. 24, 2011

(30) Foreign Application Priority Data

Jul. 19, 2006 (JP) ................. 2006-196764

(51) Int. Cl.
B65D 85/00 (2006.01)
B65D 21/032 (2006.01)
B65D 85/30 (2006.01)

(52) U.S. Cl. ....................... 206/710; 206/509

(58) Field of Classification Search ............. 206/710, 206/509, 454, 455, 445, 449, 832, 307, 308.1, 206/503, 523, 712, 711; 211/41.18
See application file for complete search history.

(56) References Cited

U.S. PATENT DOCUMENTS

| | | | | |
|---|---|---|---|---|
| 3,511,990 A | * | 5/1970 | Hauss ........................... | 378/187 |
| 3,719,273 A | * | 3/1973 | Abe ............................. | 206/712 |
| 4,778,326 A | * | 10/1988 | Althouse et al. .............. | 414/800 |
| 5,863,630 A | * | 1/1999 | Maruta et al. ................. | 428/40.1 |
| 6,286,684 B1 | * | 9/2001 | Brooks et al. ................. | 206/710 |
| 2002/0144927 A1 | * | 10/2002 | Brooks et al. ................. | 206/710 |
| 2007/0068846 A1 | * | 3/2007 | Hsiao ........................... | 206/710 |
| 2009/0297303 A1 | * | 12/2009 | Hyobu et al. ................. | 414/269 |

FOREIGN PATENT DOCUMENTS

| | | |
|---|---|---|
| JP | 10-50815 | 2/1998 |
| JP | 11-105970 | 4/1999 |
| JP | 2003-168731 | 6/2003 |
| JP | 2005-191419 | 7/2005 |

OTHER PUBLICATIONS

English language Abstract of JP 10-50815, Feb. 20, 1998.
English language Abstract of JP 11-105970, Apr. 20, 1999.
English language Abstract of JP 2003-168731, Jun. 13, 2003.
English language Abstract of JP 2005-191419, Jul. 14, 2005.
U.S. Appl. No. 12/281,491 to Kasama, which was filed Sep. 3, 2008.

* cited by examiner

*Primary Examiner* — Steven A. Reynolds
(74) *Attorney, Agent, or Firm* — Greenblum & Bernstein P.L.C.

(57) ABSTRACT

An elastic wafer-retaining cushion sheet is disposed at a wafer retaining position on the top of a wafer tray. The wafer-retaining cushion sheet has a releasably suction-adhering surface that releasably adheres by suction to the wafer tray. Consequently, there is no likelihood of the semiconductor wafer being damaged during transport or the like. In addition, the wafer-retaining cushion sheet can be readily attached to and detached from the wafer tray for washing or replacement according to need.

10 Claims, 6 Drawing Sheets

WAFER CONTAINER WITH CUSHION SHEETS

TECHNICAL FIELD

The present invention relates to a wafer container with cushion sheets (hereinafter occasionally referred to as "cushioned wafer container") for use to transport or store semiconductor wafers.

BACKGROUND ART

In a semiconductor manufacturing process, thin semiconductor wafers are carried or accommodated in a wafer container when transported between processing steps or moved or stored in each individual processing step to prevent the semiconductor wafers from being damaged or contaminated. There has been proposed a wafer container having a plurality of wafer trays superimposed over each other to accommodate each individual semiconductor wafer in an interior space formed between a pair of adjacent wafer trays so that semiconductor wafers can be safely accommodated therein independently of each other (for example, see Patent Document 1).

To safely accommodate semiconductor wafers, which have become fragile as the result of being extremely reduced in thickness in recent years, a wafer container with cushion sheets has been proposed in which a single semiconductor wafer is held between two cushion sheets in an interior space formed between two wafer trays. By being held between the cushion sheets, the semiconductor wafer is prevented from being damaged by an external force such as vibration or impact (for example, see Patent Document 2).

Patent Document 1: Japanese Patent Application Publication No. 2003-168731
Patent Document 2: Japanese Patent Application Publication No. 2005-191419

DISCLOSURE OF THE INVENTION

Problem to be Solved by the Invention

During transport or transfer of semiconductor wafers or during a semiconductor manufacturing process, a semiconductor wafer may accidentally slide in the wafer tray or the wafer tray may be tilted when the wafer tray is removed from other wafer trays, or when the condition of the semiconductor wafer thereon is checked. In many cases, wafer trays are repeatedly used; that is, they are loaded with and unloaded of semiconductor wafers many times between processing steps. Therefore, dust or the like may adhere to the cushion sheets in the course of loading and unloading the semiconductor wafers. If such dust is transferred to the semiconductor wafers from the cushion sheets, the semiconductor wafers may be fatally damaged. Therefore, the cushion sheets are preferably formed to be readily attachable to and detachable from the wafer trays so that the cushion sheets can be washed or replaced independently of the wafer trays.

An object of the present invention is to provide a wafer container with cushion sheets capable of preventing damage to semiconductor wafers during transport or the like and of enabling the cushion sheets to be readily attached to and detached from the wafer trays for washing or replacement according to need.

Means for Solving the Problem

To attain the above-described object, the present invention provides a cushioned wafer container including a plurality of wafer trays for retaining semiconductor wafers, respectively. The wafer trays are superimposed over each other to accommodate a semiconductor wafer placed over each wafer tray in an interior space formed between the wafer tray and another wafer tray that is adjacently superimposed thereover. The cushioned wafer container further includes an elastic wafer-retaining cushion sheet disposed at a wafer retaining position on the top of each wafer tray. The wafer-retaining cushion sheet has a releasably suction-adhering surface that releasably adheres by suction to the wafer tray.

It is preferable that the wafer-retaining cushion sheet should have a size sufficiently large to retain substantially the whole surface of the semiconductor wafer, and the releasably suction-adhering surface should be formed on at least a part of the reverse side of the wafer-retaining cushion sheet. The cushioned wafer container may further include a tray connecting mechanism for releasably connecting together the wafer trays superimposed over each other into a stack such that the stack of superimposed wafer trays can be disconnected at any desired position in the stack.

The cushioned wafer container may further include an elastic wafer-pressing cushion sheet disposed at the back of each wafer tray to press the semiconductor wafer against the wafer-retaining cushion sheet. The wafer-pressing cushion sheet may have a releasably suction-adhering surface that releasably adheres by suction to the back of the wafer tray. The wafer-retaining cushion sheet may have on a side thereof that contacts the semiconductor wafer a releasably suction-adhering surface that releasably adheres by suction to the semiconductor wafer. In this case, the adhesive force of the wafer-retaining cushion sheet relative to the semiconductor wafer is preferably set smaller than the adhesive force of the wafer-retaining cushion sheet relative to the wafer tray.

It should be noted that the above-described releasably suction-adhering surfaces may be each formed by a multiplicity of minute suction cups, so that pressing the minute suction cups against the adherend causes the adherend to be secured by suction to the minute suction cups. In this case, the minute suction cups may be formed from those of the cells of either an open or closed cell foam material that are open to the outside air. The minute suction cups may be formed of a foamed elastomeric polymer material, a foamed rubber polymer material, or a foamed urethane polymer material. The foamed rubber polymer material, if used, may be a foamed acrylic latex consisting essentially of an acrylic ester copolymer.

The wafer-retaining cushion sheet or the wafer-pressing cushion sheet may comprise an integrated stack of a suction-adhering layer having the releasably suction-adhering surface and a cushion layer functioning as an elastic cushion. In this case, the cushion layer may be formed of an elastomeric polymer material or an elastic foamed polymer material. In this case, at least one of the wafer-retaining cushion sheet and the wafer-pressing cushion sheet preferably has a surface electrical resistance in the range of from $10^8 \Omega$ to $10^{10} \Omega$.

Advantageous Effects of the Invention

According to the present invention, an elastic wafer-retaining cushion sheet is disposed at a wafer retaining position on the top of a wafer tray. The cushion sheet has a releasably suction-adhering surface that releasably adheres by suction to the wafer tray. Consequently, there is no likelihood of the semiconductor wafer being damaged during transport or the like. In addition, the cushion sheet can be readily attached to and detached from the wafer tray for washing or replacement according to need.

EXPLANATION OF REFERENCE NUMERALS

1: wafer tray
5: retaining cushion (wafer-retaining cushion sheet)
5A: cushion layer
5B: suction-adhering layer
5C: suction-adhering layer
8: connecting hole (tray connecting mechanism)
9: connecting hook (tray connecting mechanism)
13: bottom surface
14: back
15: pressing cushion (wafer pressing cushion sheet)
15A: cushion layer
15B: suction-adhering layer
W: semiconductor wafer

BEST MODE FOR CARRYING OUT THE INVENTION

Embodiments of the present invention will be explained below with reference to the accompanying drawings.

Figure 2:
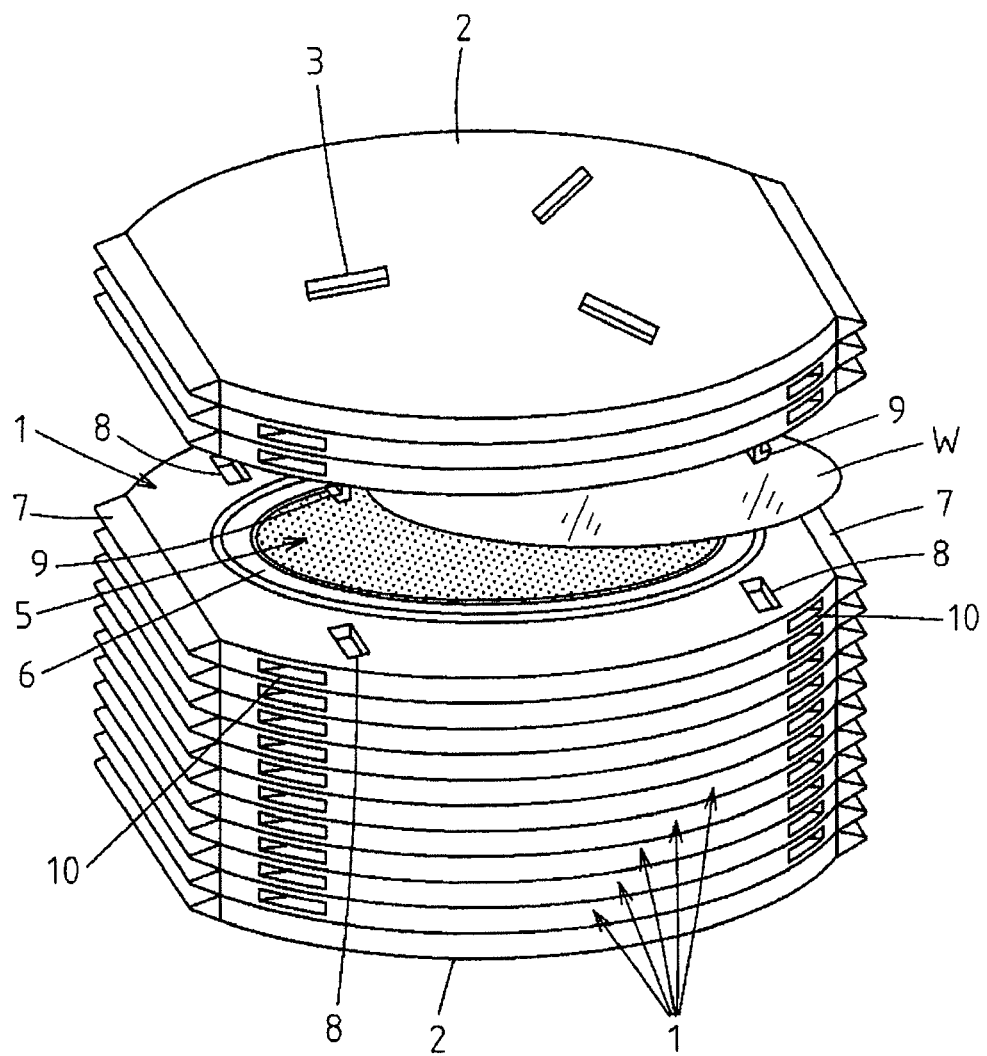
FIG. 2 is a perspective view of a multiplicity of superimposed wafer trays of a cushioned wafer container according to the first embodiment of the present invention, showing a state where a part of the superimposed wafer trays is separated from the rest thereof.

FIG. 2 shows the general arrangement of a wafer container with cushion sheets. The wafer container has a plurality of vertically superimposed horizontal wafer trays 1 for retaining semiconductor wafers W thereon, respectively. It should be noted that FIG. 2 shows the wafer container in a state where a part of superimposed wafer trays 1 is separated from the rest thereof. A pair of base trays 2 are attached to the upper and lower ends of the stack of superimposed wafer trays 1. The base trays 2 are provided with connecting grooves 3 for connection with mechanical interfaces (not shown).

The wafer trays 1 are molded from a plastic material, e.g. a polycarbonate resin. When the wafer trays 1 are superimposed over each other, a semiconductor wafer W placed over each wafer tray 1 is accommodated in an interior space formed between the wafer tray 1 and another wafer tray 1 adjacently superimposed thereover. It should be noted, however, that the semiconductor wafer W is placed on a wafer-retaining cushion sheet 5 (hereinafter referred to simply as "retaining cushion 5") attached to the top of the wafer tray 1. An elastic annular seal member 6 is disposed outside the periphery of the retaining cushion 5 so as to surround it entirely. Each wafer tray 1 has grips 7 formed at 180° symmetric positions on the outer edge thereof to enable each wafer tray 1 to be individually held by a machine.

Each wafer tray 1 has connecting holes 8 formed on the top thereof at respective positions (e.g. four positions) closer to the outer edge thereof than the annular seal member 6 to connect the wafer tray 1 to another wafer tray 1 superimposed thereover. Correspondingly to the connecting holes 8, downwardly projecting connecting hooks 9 are formed at four positions on the back of each wafer tray 1 so as to disengageably engage with the connecting holes 8. Thus, the connecting holes 8 and the connecting hooks 9 constitute a tray connecting mechanism for releasably connecting together a plurality of wafer trays 1 superimposed over each other into a stack such that the stack of superimposed wafer trays 1 can be disconnected at any desired position in the stack. Reference numeral 10 denotes key holes for insertion of an unhook key (not shown) for disengaging the connecting hooks 9 from the connecting holes 8.

Figure 3:
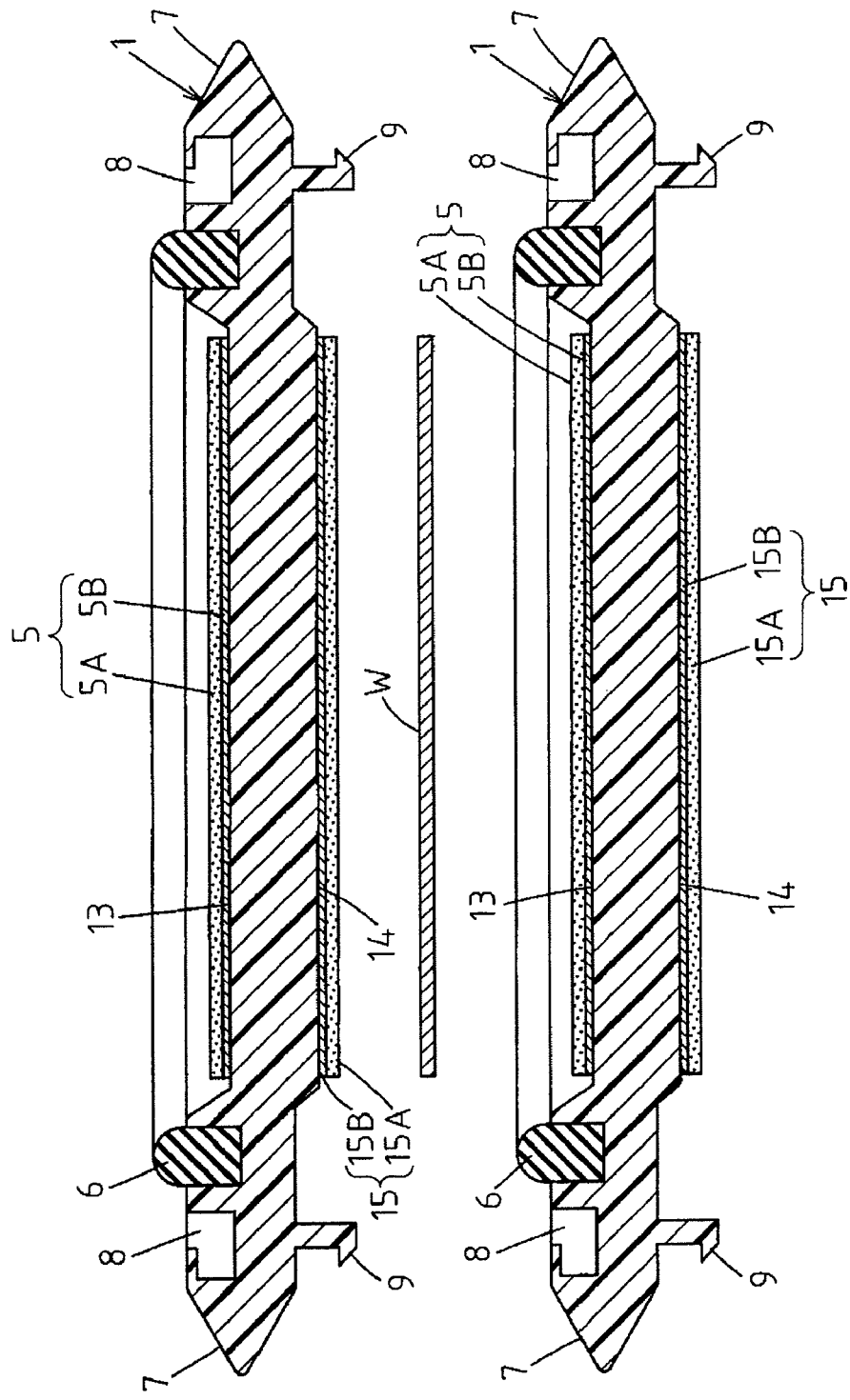
FIG. 3 is a sectional side view of two wafer trays as being separate from each other in the first embodiment of the present invention.
Figure 4:
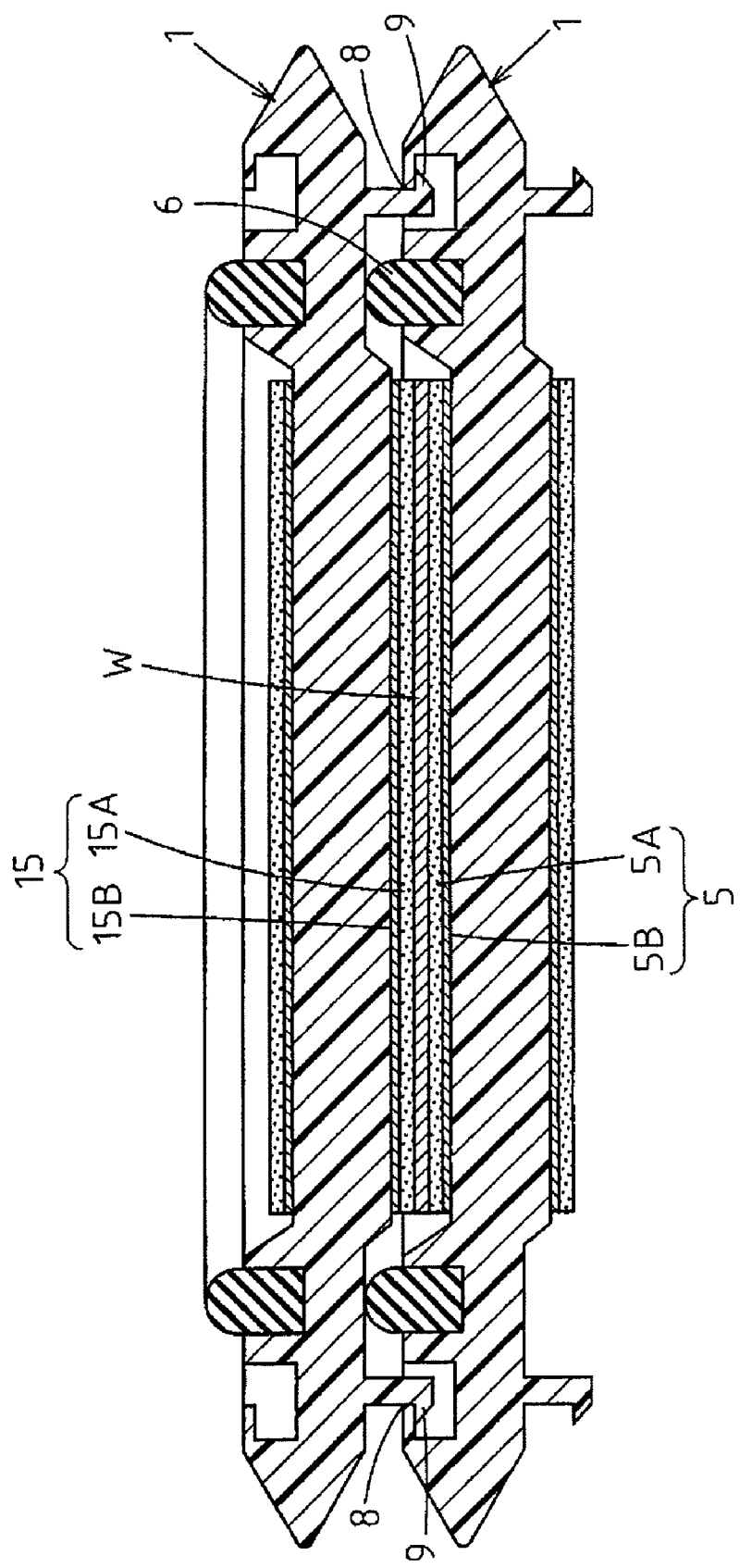
FIG. 4 is a sectional side view of two wafer trays as connected together in the first embodiment of the present invention.

FIGS. 3 and 4 are sectional side views showing, respectively, a state where two wafer trays 1 are separate from each other and a state where these wafer trays 1 are superimposed over each other. It should be noted that, in these figures, sectional views taken at different positions are combined together to show the sections of the connecting hooks 9. The annular seal member 6 on each wafer tray 1 is disposed in such a manner that the lower half thereof is fitted into an annular groove formed on the top of the wafer tray 1 at a position slightly inward of the outer edge thereof. Each wafer tray 1 is formed in a dish-like shape. That is, the upper side of the wafer tray 1 is recessed at a portion thereof located inward of the annular seal member 6, and a portion of the lower side of the wafer tray 1 that is located inward of the annular seal member 6 projects downward. This configuration is effective in retaining the semiconductor wafer W in the wafer tray 1 so that the semiconductor wafer W will not readily slide off the wafer tray 1.

The retaining cushion 5 is formed into a disk-like shape of a size sufficiently large to retain substantially the whole surface of the semiconductor wafer W by using a material that has no chemically adverse effect on the semiconductor wafer W throughout it (e.g. a material that will not generate impurity gas more than a prescribed amount). The retaining cushion 5 comprises an integrated stack of a cushion layer 5A functioning as an elastic cushion that protects the semiconductor wafer W from an external impact or the like, and a suction-adhering layer 5B having a releasably suction-adhering surface that releasably adheres by suction to the bottom surface 13 of the wafer tray 1. Of the two layers, the cushion layer 5A is formed of an elastic polymer material, e.g. a foamed polymer material, such as foamed urethane, or an elastomeric polymer material.

Figure 5:
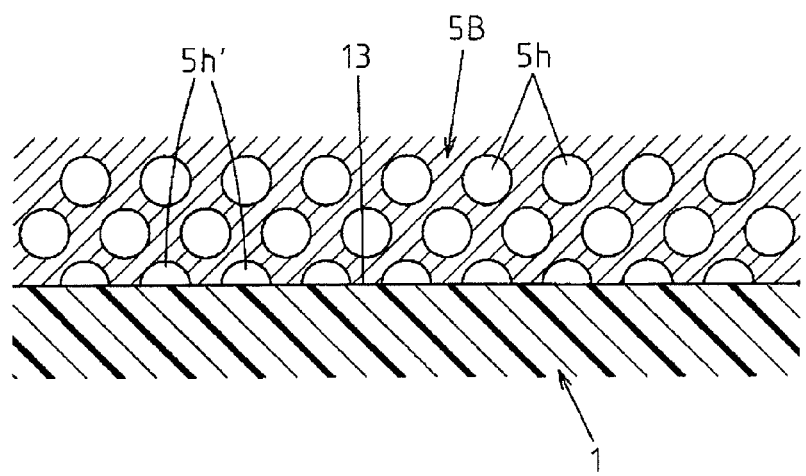
FIG. 5 is a schematic sectional view of a suction-adhering layer in the first embodiment of the present invention.

The suction-adhering layer 5B, which forms a reverse-side layer of the retaining cushion 5, is formed of a material that is unlikely to have a chemically adverse effect on the surroundings, e.g. a foamed rubber polymer material such as a foamed acrylic latex consisting essentially of an acrylic ester copolymer, a foamed elastomeric polymer material, or a foamed urethane polymer material. As schematically shown in FIG. 5, the suction-adhering layer 5B is formed from a foam material and hence has a large number of cells 5h formed therein. Of the cells 5h, cells 5h' that are open to the outside air at the reverse side of the suction-adhering layer 5B function as minute suction cups, respectively. Accordingly, in this embodiment the whole reverse surface of the suction-adhering layer 5B form minute suction cups (it should be noted that minute suction cups may be formed only on a part of the reverse surface). By pressing the minute suction cups to an adherend, i.e. the bottom surface 13 of the wafer tray 1, the minute suction cups are secured by suction to the bottom surface 13 of the wafer tray 1. It should be noted that the bottom surface 13 of the wafer tray 1 is preferably a smooth surface to ensure the adhesive force required for this purpose. It is also preferable that the minute suction cups (cells 5h') of the suction-adhering layer 5B have an average diameter of not less than about 10 μm and not more than about 50 μm. It should be noted that the cells 5h may be either open cells or closed cells. In FIG. 5, the cells 5h are simplified and schematically shown.

Figure 1:
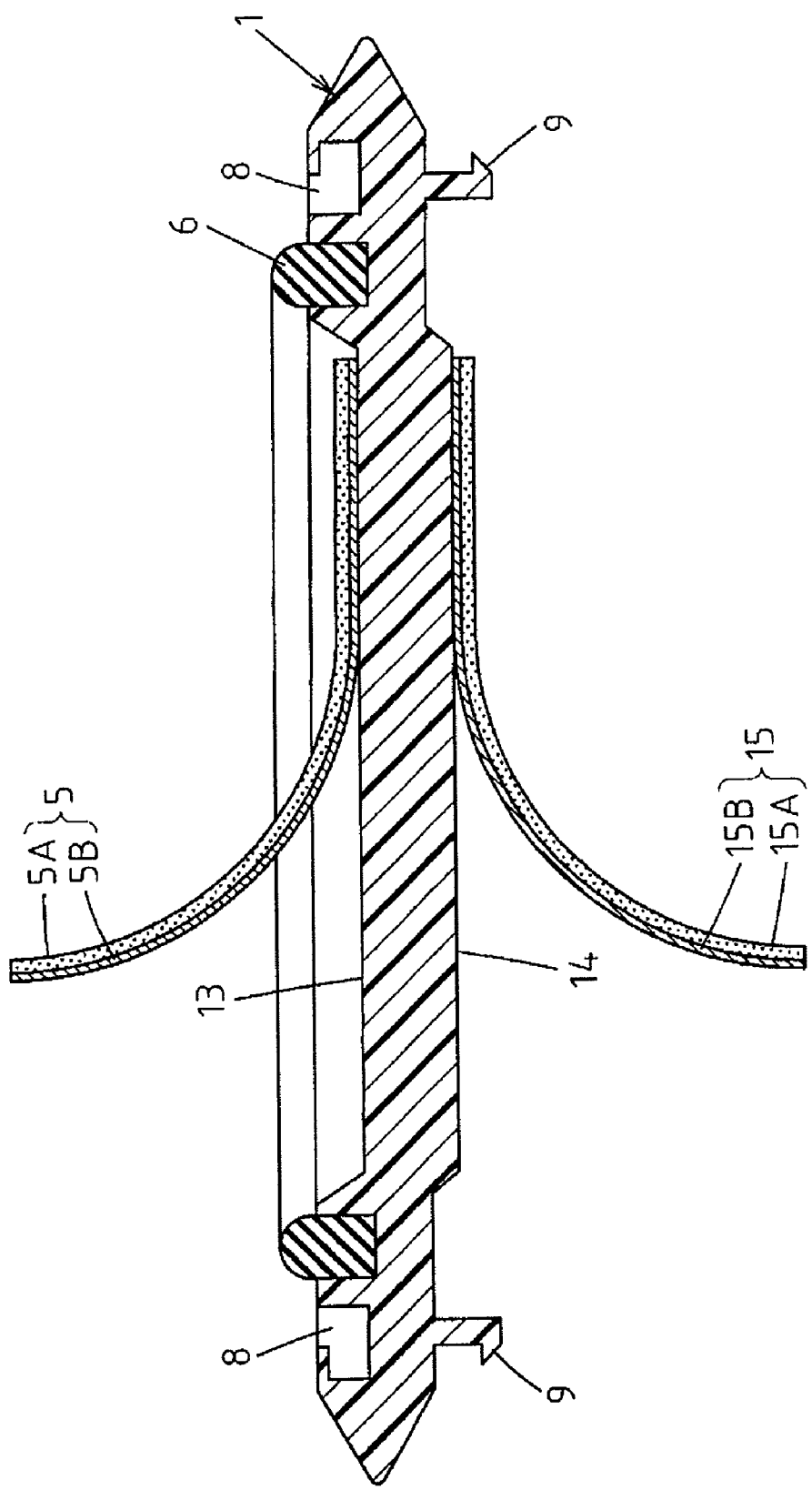
FIG. 1 is a sectional side view showing the way in which a cushion sheet is removed from a wafer tray in a first embodiment of the present invention.

The retaining cushion 5 arranged as stated above functions as follows. If it is pressed against the bottom surface 13 of the wafer tray 1 over the entire surface thereof with a certain force, the retaining cushion 5 is secured by suction to the bottom surface 13 of the wafer tray 1 by the suction-adhering action of the reverse surface of the suction-adhering layer 5B. Consequently, even if the wafer tray 1 is tilted alone, there is no likelihood that the retaining cushion 5 will slide off the wafer tray 1. The retaining cushion 5 can be readily removed from the bottom surface 13 of the wafer tray 1, as shown in FIG. 1, by an operator holding it between his or her fingers and pulling it with a certain force. Thus, the retaining cushion 5 can be removed from the wafer tray 1 for washing or replacement according to need.

Referring back to FIG. 3, each wafer tray 1 has an elastic wafer-pressing cushion sheet 15 (hereinafter referred to simply as "pressing cushion 15") removably attached by suction to the back 14 thereof to press the underlying semiconductor wafer W against the retaining cushion 5 of the lower adjacent wafer tray 1. The pressing cushion 15 in this embodiment is formed in a disk-like shape of a size sufficiently large to press a predetermined region of the semiconductor wafer W or substantially the whole surface thereof by using a material that has no chemically adverse effect on the semiconductor wafer W, in the same way as the retaining cushion 5. Specifically, the pressing cushion 15 comprises an integrated stack of a cushion layer 15A functioning as an elastic cushion and a suction-adhering layer 15B having a releasably suction-adhering surface that releasably adheres by suction to the back (lower side) 14 of the wafer tray 1.

The cushion layer 15A and the suction-adhering layer 15B, which form the pressing cushion 15 in this embodiment, are arranged in the same way as the cushion layer 5A and the suction-adhering layer 5B, which form the above-described retaining cushion 5. Accordingly, the pressing cushion 15 can be removably secured by suction to the back 14 of the wafer tray 1. The pressing cushion 15 can be readily removed from the back 14 of the wafer tray 1 for washing or replacement, as shown in FIG. 1, by an operator holding it with his or her fingers and pulling it with a certain force.

Referring back to FIGS. 3 and 4 again, each connecting hook 9 has an elongated stem portion projecting from the back of the wafer tray 1 and an outwardly bent L-shaped hook portion integrally formed at the distal end of the stem portion. Accordingly, as shown in FIG. 4, when a wafer tray 1 is superimposed over a lower wafer tray 1 and pressed against the latter, the hook portion of each connecting hook 9 enters the associated connecting hole 8 while elastically deforming the stem portion thereof. After the hook portion has entered the connecting hole 8, the connecting hook 9 returns to its previous form before the elastic deformation. As a result, the hook portion of the connecting hook 9 is undisengageably engaged in the connecting hole 8, and thus the two superimposed wafer trays 1 are connected to each other.

Consequently, the annular seal member 6 fitted to the lower wafer tray 1 is pressed and elastically deformed over its entire periphery by the back of the upper wafer tray 1. Thus, the space accommodating the semiconductor wafer W inside the annular seal member 6 is sealed off from the outside. As a result, the semiconductor wafer W placed on the lower wafer tray 1 is elastically held between the retaining cushion 5 of the lower wafer tray 1 and the pressing cushion 15 of the upper wafer tray 1. Thus, the semiconductor wafer W is retained safely without being directly subjected to an external influence such as an impact. In this way, an appropriate number of wafer trays 1 respectively retaining semiconductor wafers W are superimposed over each other and connected together, and in this state, the semiconductor wafers W can be safely transported and stored.

Figure 6:
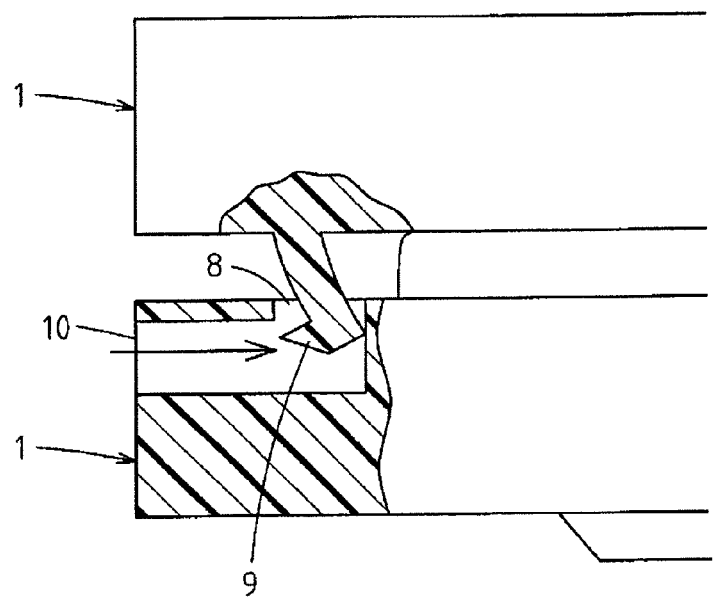
FIG. 6 is a fragmentary sectional view showing the way in which two wafer trays are disconnected from each other in the first embodiment of the present invention.

When a semiconductor wafer W is to be unloaded, as shown in FIG. 6, an unhook key (not shown) is inserted into the key hole 10, causing the stem portion of the connecting hook 9 to be elastically deformed so that the connecting hook 9 is disengageable from the connecting hole 8. Accordingly, the upper wafer tray 1 can be lifted and separated from the lower wafer tray 1. At this time, the semiconductor wafer W retained by the lower wafer tray 1 is on the retaining cushion 5 thereof. Therefore, the semiconductor wafer W can be inspected in the state of being retained on the retaining cushion 5.

Figure 7:
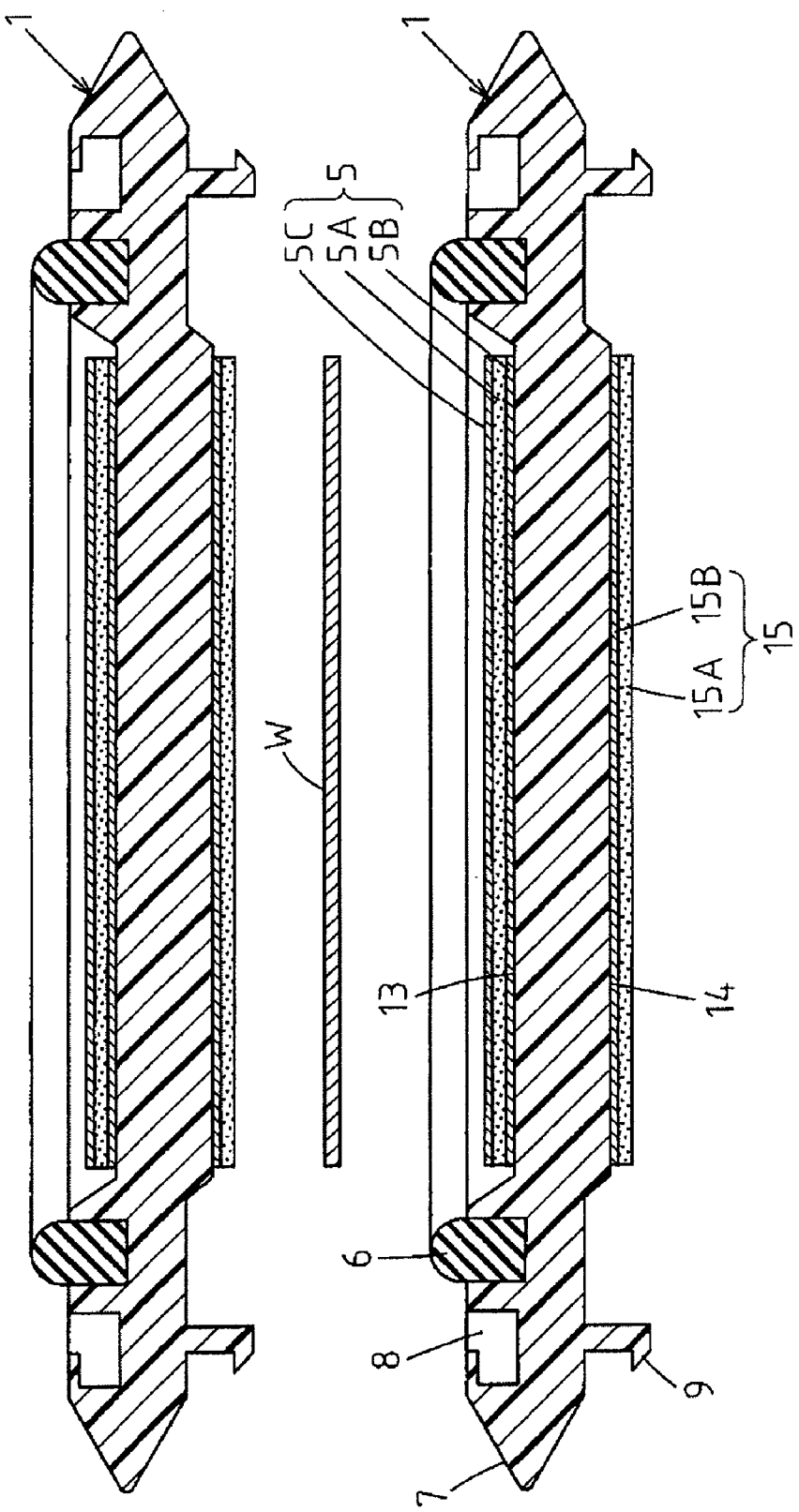
FIG. 7 is a sectional side view of two wafer trays as being separate from each other in a second embodiment of the present invention.

FIG. 7 shows a cushioned wafer container according to a second embodiment of the present invention. The cushioned wafer container of the second embodiment has a suction-adhering layer 5C integrally stacked on the side of the retaining cushion 5 that contacts the semiconductor wafer W. The suction-adhering layer 5C has a releasably suction-adhering surface that releasably adheres by suction to the semiconductor wafer W. The arrangement of the suction-adhering layer 5C is the same as that of the suction-adhering layer 5B shown in the foregoing first embodiment. That is, the releasably suction-adhering surface is formed by a multiplicity of minute suction cups. The arrangement of the rest of the second embodiment is the same as in the first embodiment.

Consequently, the second embodiment is advantageous in that the semiconductor wafer W and the retaining cushion 5 retaining the semiconductor wafer W are both releasably secured by suction, and hence the semiconductor wafer W can be always kept flat without being warped. It should be noted, however, that the adhesive force of the suction-adhering layer 5C relative to the semiconductor wafer W is set smaller than the adhesive force of the suction-adhering layer 5B relative to the wafer tray 1 to allow the retaining cushion 5 to be kept secured by suction to the wafer tray 1 when the semiconductor wafer W is removed from the wafer tray 1. Such adhesive force setting can be readily realized by making the minute suction cups (cells 5h') of the suction-adhering layer 5B for the wafer tray 1 and those of the suction-adhering layer 5C for the semiconductor wafer W appropriately different in size from each other.

Incidentally, the semiconductor wafer W generally has a surface electrical resistance of the order of $10^9 \Omega$. Therefore, if the retaining cushion 5 and the pressing cushion 15, which contact the reverse and obverse sides, respectively, of the semiconductor wafer W, are designed to have a surface electrical resistance substantially equal to that of the semiconductor wafer W, it is possible to suppress adhesion of dust to the surface of contact with the semiconductor wafer W and electrically adverse effect on electronic circuits formed on the semiconductor wafer W. Accordingly, it is preferable that at least either of the retaining cushion 5 and the pressing cushion 15 should have a surface electrical resistance in the range of from $10^8\Omega$ to $10^{10}\Omega$. It is most desirable that both the retaining cushion 5 and the pressing cushion 15 should have a surface electrical resistance of the order of $10^9\Omega$, i.e. the same surface electrical resistance as that of the semiconductor wafer W.

It should be noted that the present invention is not limited to the foregoing embodiments. For example, either of the retaining cushion 5 and the pressing cushion 15 need not necessarily retain the whole surface of the semiconductor wafer W. The tray connecting mechanism is not limited to the structure in which the connecting hooks 9 are engaged in the connecting holes 8, but may be any other tray connecting structure.

The invention claimed is:

1. A cushioned wafer container comprising:
   a plurality of wafer trays for retaining semiconductor wafers, respectively, said wafer trays being superimposed over each other to accommodate a semiconductor wafer placed over each of said wafer trays in an interior space formed between said each of said wafer trays and another of said wafer trays that is adjacently superimposed thereover;
   an elastic wafer-retaining cushion sheet disposed at a wafer retaining position on a top of each of said wafer trays, said wafer-retaining cushion sheet comprising an integrated stack of an upper cushion layer functioning as an elastic cushion and a lower suction-adhering layer having a releasably suction-adhering surface that releasably adheres by suction to the top of said each of said wafer trays;
   said releasably suction-adhering surface being formed by a multiplicity of minute suction cups, so that pressing said minute suction cups against the top of said each of said wafer trays causes said minute suction cups to be secured by suction to the top of said each of said wafer trays;
   wherein said wafer-retaining cushion sheet has a suction-adhering layer formed on a side thereof that contacts said semiconductor wafer, said suction-adhering layer being integrally stacked on said cushion layer and having a releasably suction-adhering surface that releasably adheres by suction to said semiconductor wafer; and
   wherein an adhesive force of said wafer-retaining cushion sheet relative to said semiconductor wafer is set smaller than an adhesive force of said wafer-retaining cushion sheet relative to said wafer tray.

2. The cushioned wafer container of claim 1, wherein said wafer-retaining cushion sheet has a size sufficiently large to retain substantially a whole surface of said semiconductor wafer, said releasably suction-adhering surface being formed on at least a part of a reverse side of said wafer-retaining cushion sheet.

3. The cushioned wafer container of claim 1, further comprising:
   a tray connecting mechanism for releasably connecting together said wafer trays superimposed over each other into a stack such that the stack of said wafer trays can be disconnected at any desired position in the stack.

4. The cushioned wafer container of claim 1, further comprising:
   an elastic wafer-pressing cushion sheet disposed at a back of each of said wafer trays to press said semiconductor wafer against said wafer-retaining cushion sheet.

5. The cushioned wafer container of claim 4, wherein said wafer-pressing cushion sheet comprises an integrated stack of a lower cushion layer functioning as an elastic cushion and an upper suction-adhering layer having a releasably suction-adhering surface that releasably adheres by suction to the back of said each of said wafer trays.

6. The cushioned wafer container of claim 1, wherein said minute suction cups have an average diameter in a range of from 10 μm to 50 μm.

7. The cushioned wafer container of claim 6, wherein said minute suction cups are formed from those of cells of either an open or closed cell foam material that are open to an outside air.

8. The cushioned wafer container of claim 7, wherein said minute suction cups are formed of a foamed elastomeric polymer material, a foamed rubber polymer material, or a foamed urethane polymer material.

9. The cushioned wafer container of claim 8, wherein said foamed rubber polymer material is a foamed acrylic latex consisting essentially of an acrylic ester copolymer.

10. The cushioned wafer container of claim 4, wherein at least one of said wafer-retaining cushion sheet and said wafer-pressing cushion sheet has a surface electrical resistance in a range of from $10^8\Omega$ to $10^{10}\Omega$.

* * * * *